(12) United States Patent
Anderson et al.

(10) Patent No.: US 7,247,908 B2
(45) Date of Patent: Jul. 24, 2007

(54) METHOD OF FABRICATING A FINFET

(75) Inventors: Brent A. Anderson, Jericho, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/213,231

(22) Filed: Aug. 26, 2005

(65) Prior Publication Data
US 2005/0280090 A1 Dec. 22, 2005

Related U.S. Application Data

(62) Division of application No. 10/605,905, filed on Nov. 5, 2003, now Pat. No. 6,962,843.

(51) Int. Cl.
*H01L 29/94* (2006.01)
*H01L 31/062* (2006.01)

(52) U.S. Cl. ............... 257/327; 257/347; 257/352; 257/507; 257/E27.112

(58) Field of Classification Search ........... 257/327, 257/347, 352, 506, 507, E27.112
See application file for complete search history.

(56) References Cited

U.S. PATENT DOCUMENTS

| | | | |
|---|---|---|---|
| 6,359,311 B1 * | 3/2002 | Colinge et al. ............ 257/347 |
| 6,709,982 B1 | 3/2004 | Buynoski et al. | |
| 6,800,917 B2 * | 10/2004 | Haynie et al. ............ 257/506 |
| 6,852,576 B2 | 2/2005 | Lin et al. | |
| 6,855,583 B1 | 2/2005 | Krivokapic et al. | |
| 6,867,433 B2 | 3/2005 | Yeo et al. | |
| 6,872,647 B1 | 3/2005 | Yu et al. | |
| 7,074,656 B2 * | 7/2006 | Yeo et al. ................. 438/157 |
| 7,087,499 B2 * | 8/2006 | Rankin et al. ............ 438/412 |
| 2005/0205932 A1 * | 9/2005 | Cohen ...................... 257/347 |
| 2006/0172497 A1 * | 8/2006 | Hareland et al. .......... 438/286 |

\* cited by examiner

*Primary Examiner*—Matthew E. Warren
(74) *Attorney, Agent, or Firm*—Schmeiser, Olsen & Watts; William D. Sabo

(57) ABSTRACT

A FinFET structure and method of forming a FinFET device. The method includes: (a) providing a semiconductor substrate, (b) forming a dielectric layer on a top surface of the substrate; (c) forming a silicon fin on a top surface of the dielectric layer; (d) forming a protective layer on at least one sidewall of the fin; and (e) removing the protective layer from the at least one sidewall in a channel region of the fin. In a second embodiment, the protective layer is converted to a protective spacer.

15 Claims, 10 Drawing Sheets

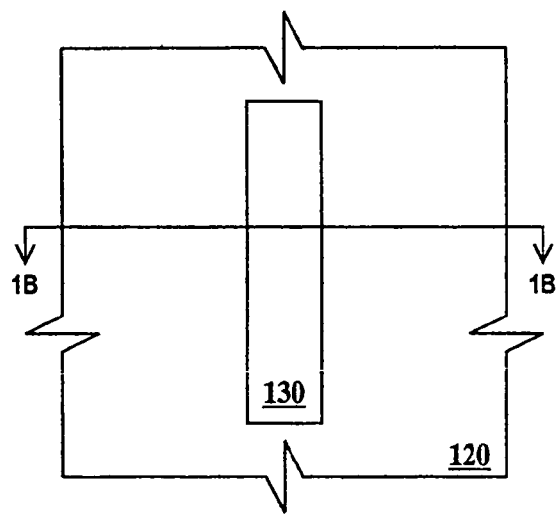
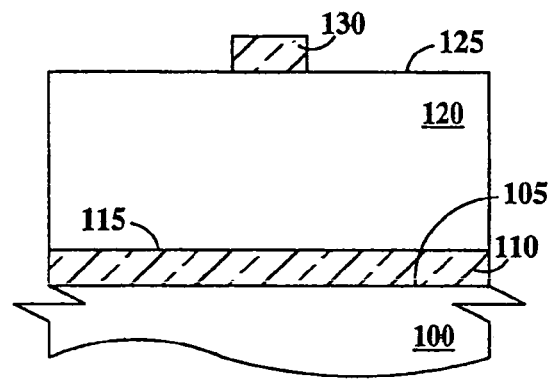
*FIG. 1A*  *FIG. 1B*
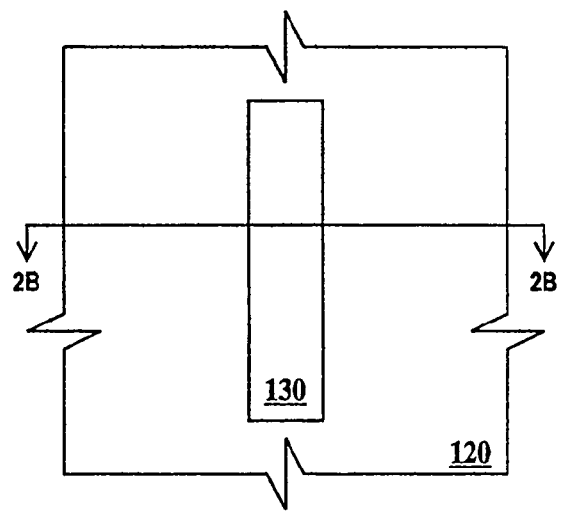
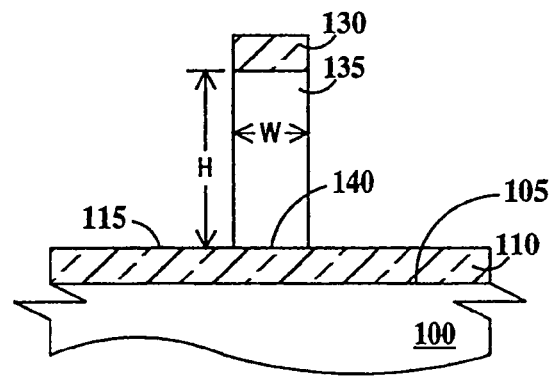
*FIG. 2A*  *FIG. 2B*

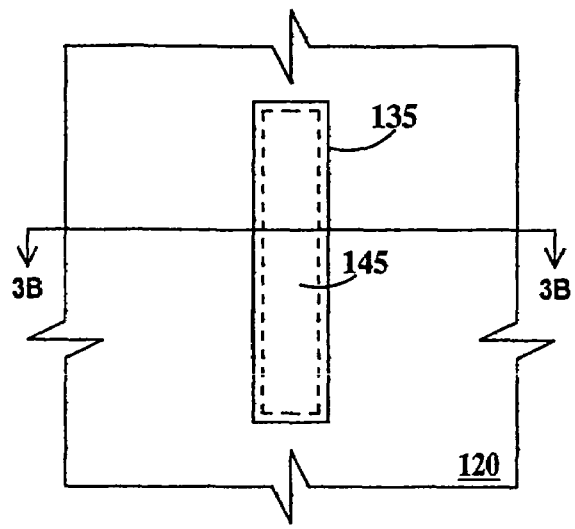 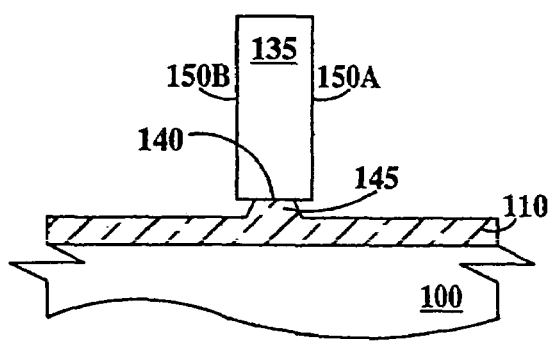
*FIG. 3A*  *FIG. 3B*
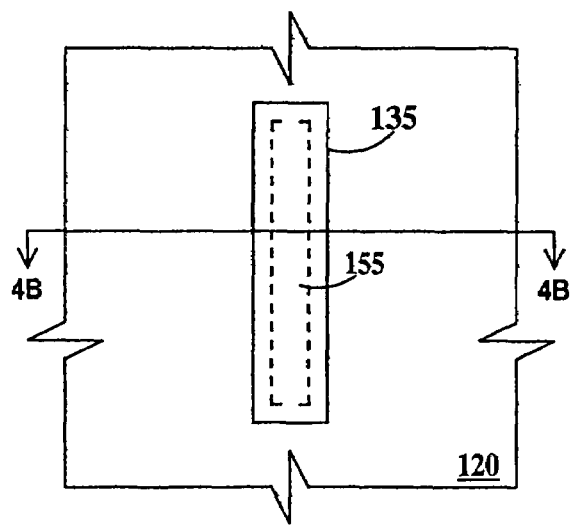 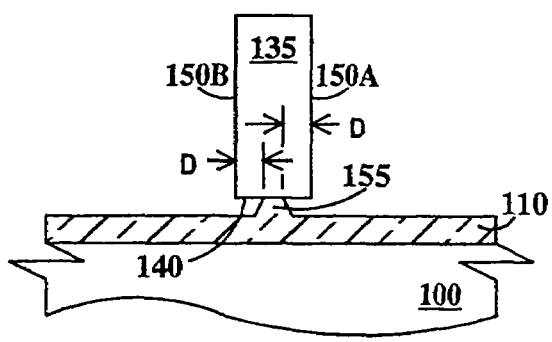
*FIG. 4A*  *FIG. 4B*

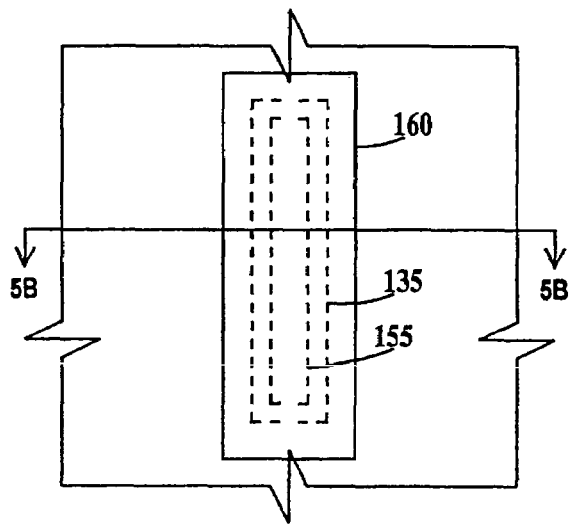
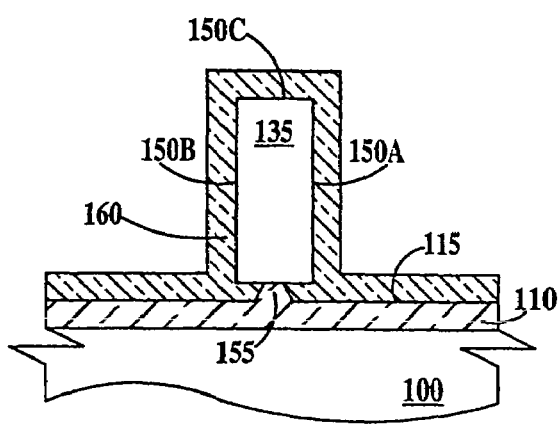
*FIG. 5A*     *FIG. 5B*
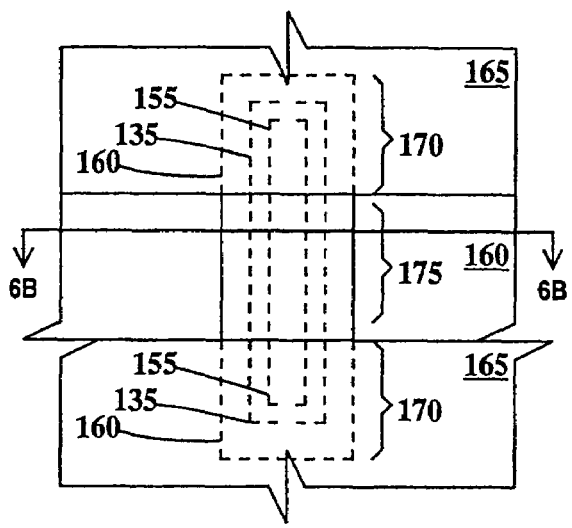
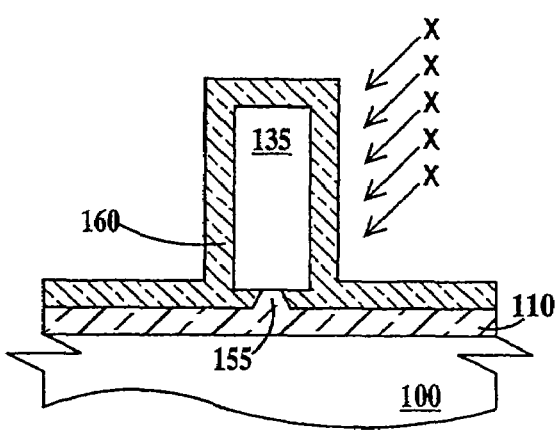
*FIG. 6A*     *FIG. 6B*

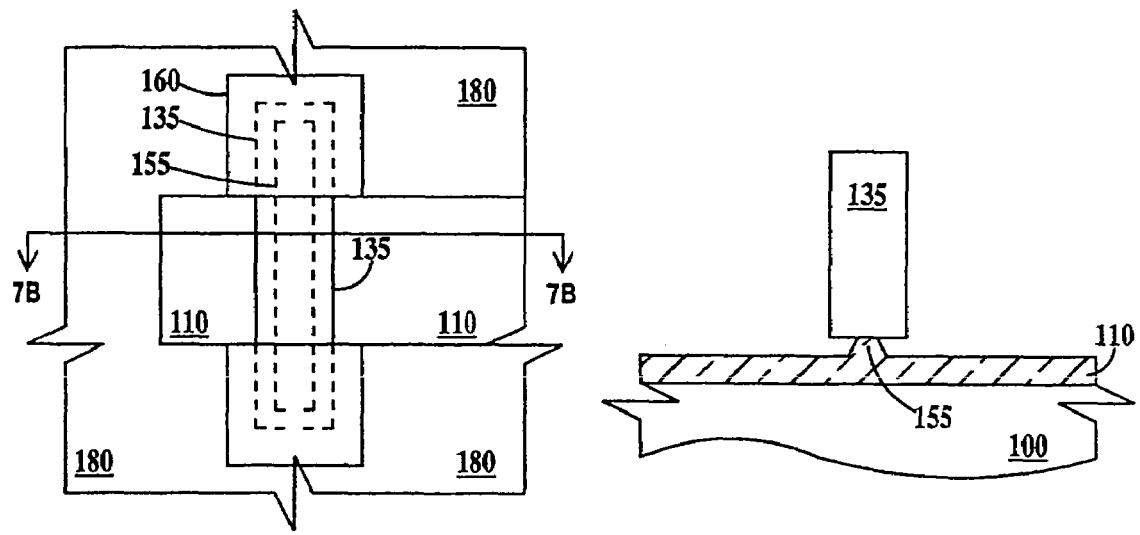
*FIG. 7A*  *FIG. 7B*
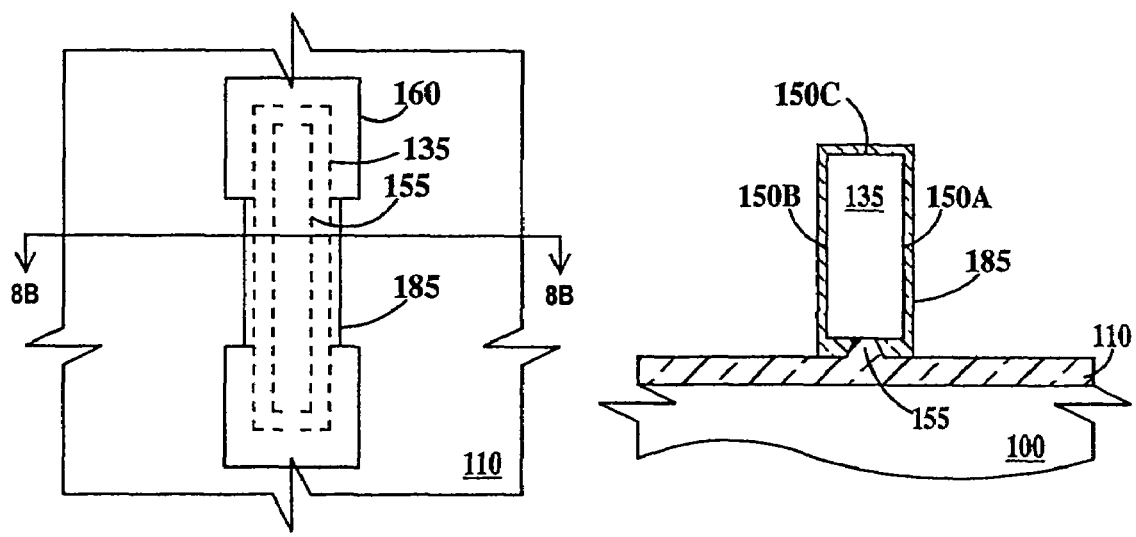
*FIG. 8A*  *FIG. 8B*

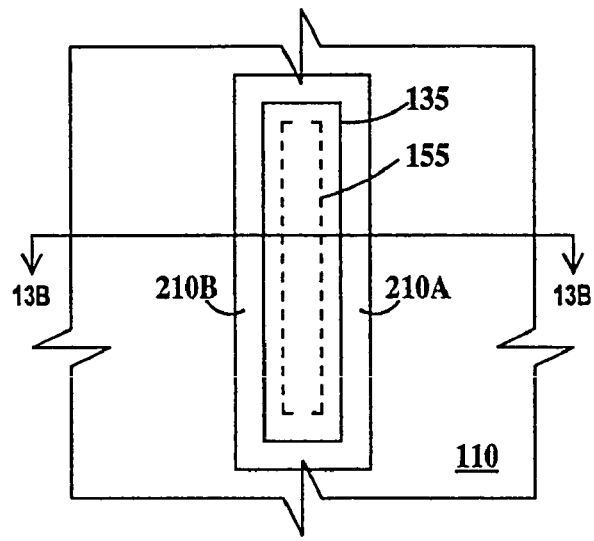 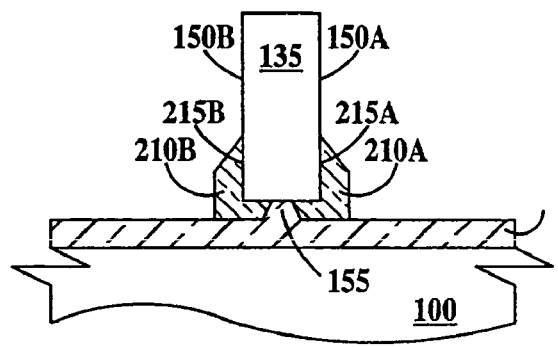
*FIG. 13A*     *FIG. 13B*
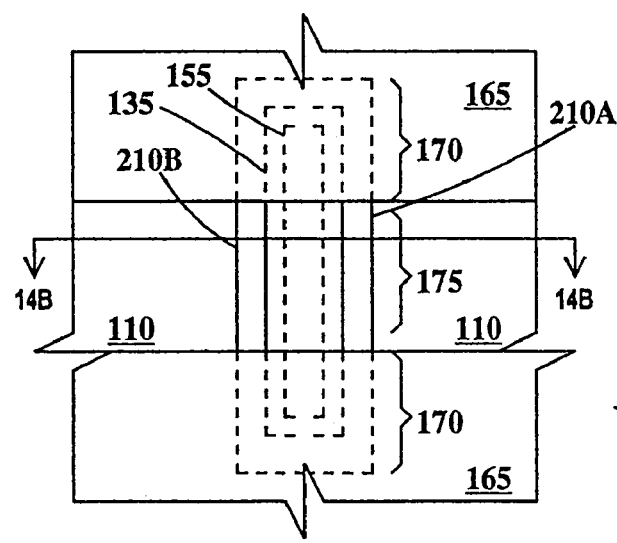 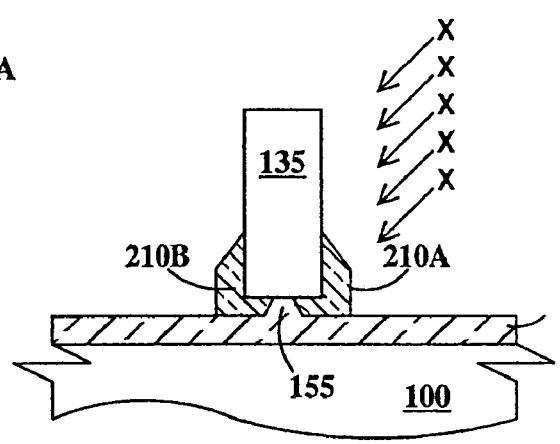
*FIG. 14A*     *FIG. 14B*

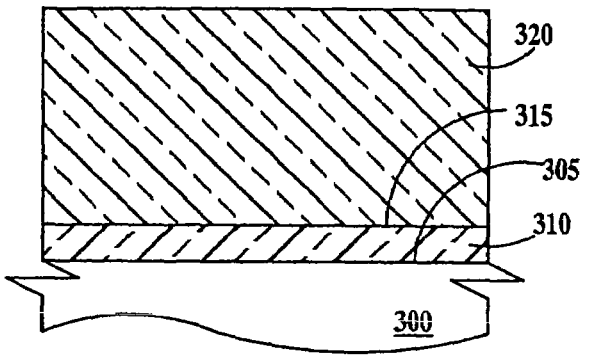
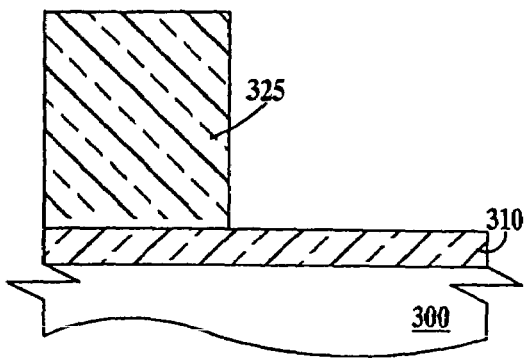
FIG. 17A
FIG. 17B
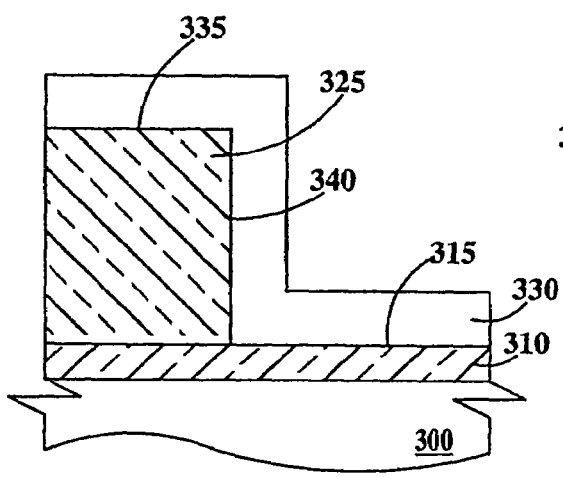
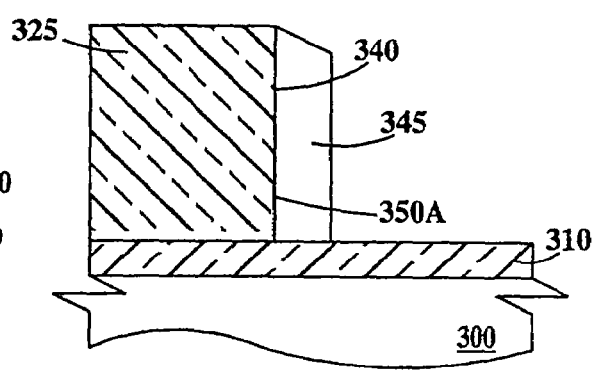
FIG. 17C
FIG. 17D

METHOD OF FABRICATING A FINFET

This application is a divisional application of Ser. No. 10/605,905; filed on Nov. 5, 2003 now U.S. Pat. No. 6,962,843.

FIELD OF THE INVENTION

The present invention relates to the field of semiconductor devices; more specifically, it relates to method of fabricating a fin field effect transistor (FinFET).

BACKGROUND OF THE INVENTION

In FinFET technology, a vertical "fin" of crystalline silicon is used to form the body of a transistor and a gate is formed on a sidewall of the body. When gates are formed on both sidewalls of the body, the transistor is generally referred to as a double gated FinFET.

As FinFET density increases, both the fin thickness and the gate dielectric thickness formed on the fin decreases. This presents two problems. First, thinner gate dielectrics require cleaner and crystallographically more ideal fin sidewalls than present FinFET fabrication techniques can produce. Second, when present fin fabrication techniques are applied to produce thin fins, the resultant fins are weakly attached to the supporting substrate.

Therefore, there is a need for a method of fabricating FinFETs having very thin fins that have sidewall surfaces that are crystallographically close to perfect and that overcomes the inherent structural weakness of thin fins.

SUMMARY OF THE INVENTION

A first aspect of the present invention is a method of forming a FinFET device, comprising: (a) providing a semiconductor substrate, (b) forming a dielectric layer on a top surface of the substrate; (c) forming a silicon fin on a top surface of the dielectric layer; (d) forming a protective layer on at least one sidewall of the fin; and (e) removing the protective layer from the at least one sidewall in a channel region of the fin.

A second aspect of the present invention is a method of forming a FinFET device, comprising: (a) providing a semiconductor substrate, (b) forming a dielectric layer on a top surface of the substrate; (c) forming a silicon fin having sidewalls on a top surface of the dielectric layer; and (d) forming a protective spacer on at least a lower portion of at least one of the sidewalls.

A third aspect of the present invention is a FinFET device, comprising: a semiconductor substrate, a dielectric layer on a top surface of the substrate; a silicon fin having sidewalls, the fin on a top surface of the dielectric layer; and a protective spacer on at least a lower portion of at least one of the sidewalls.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 10A are top views and corresponding FIGS. 1B through 10B are cross-sectional views illustrating fabrication of a FinFET structure according to a first embodiment of the present invention;

FIGS. 12A through 16A are top views and corresponding FIGS. 12B through 16B are cross-sectional views illustrating fabrication of a FinFET structure according to a second embodiment of the present invention; and FIGS. 17A through 17F are cross-sectional views illustrating fabrication of a FinFET structure according to a third embodiment of the present invention.

DETAILED DESCRIPTION OF THE INVENTION

Figures 9A, 9B:
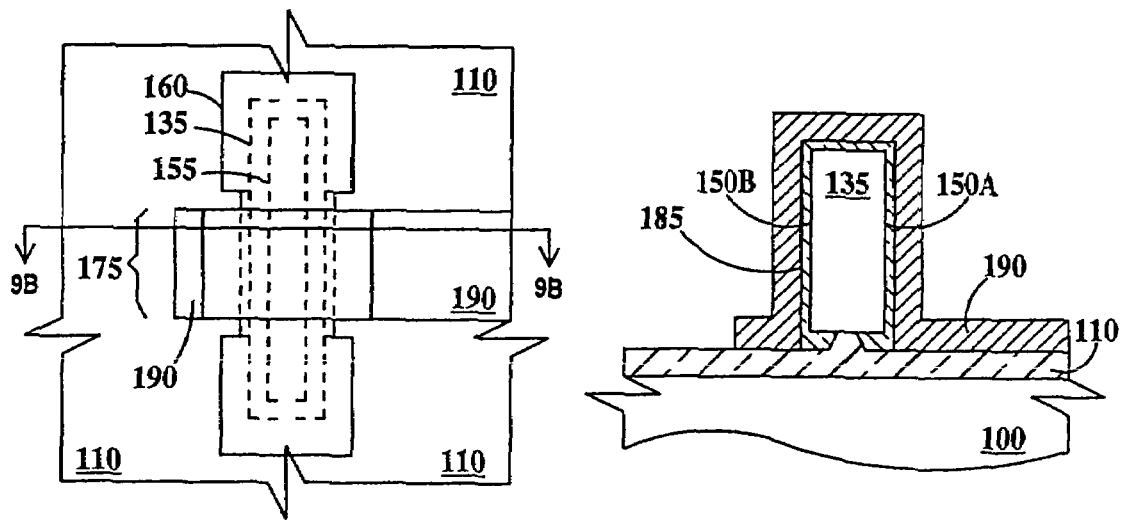

FIGS. 1A through 9A are top views and corresponding FIGS. 1B through 9B are cross-sectional views illustrating fabrication of a FinFET structure according to a first embodiment of the present invention.

FIG. 1B is a cross-sectional view through line 1B-1B of FIG. 1A. In FIGS. 1A and 1B, a semiconductor substrate 100 is provided. In one example, substrate 100 is mono-crystalline silicon. Formed on a top surface 105 of substrate 100 is a buried dielectric layer, in the present exampled a buried oxide layer (BOX) 110. Formed on a top surface 115 of BOX 110 is a silicon layer 120. In one example, silicon layer 120 is about 200 to 2000 Å thick. Silicon layer 120 may be mono-crystalline-silicon, poly-crystalline silicon or amorphous silicon. Substrate 100, BOX 110 and silicon layer 120 may be obtained as a Silicon-on-Insulator (SOI) substrate or a SIMOX substrate. An etch mask 130 is formed on a top surface of silicon layer 125. In one example, etch mask 130 is formed by applying a photoresist layer to top surface 125 of silicon layer 120 and photo-lithographically patterning the photo-resist layer.

FIG. 2B is a cross-sectional view through line 2B-2B of FIG. 2A. In FIGS. 2A and 2B, a reactive ion etch (RIE) process (using, for example CF4) is performed to remove unwanted silicon from silicon layer 120 above BOX 110 and leave a fin 135. Fin 135 has a width W and a height H. The height H is the same as the thickness of silicon layer 120 of FIG. 1B, which is about 500 to 2000 Å. In one example, W is about 50 to 350 Å. A base surface 140 of fin 135 is in direct physical contact with top surface 115 of BOX 110 and this contact and adhesion between the fin and the BOX supports the fin.

FIG. 3B is a cross-sectional view through line 3B-3B of FIG. 3A. In FIGS. 3A and 3B, mask 130 (see FIG. 2B) is removed using a buffered hydrofluoric acid (BHF) causing undercut of BOX 110 under base surface 140 of fin 135. Fin 135 is now supported only by a pedestal 145 of BOX material. Sidewalls 150A and 150B of fin 135 extend past pedestal 145.

FIG. 4B is a cross-sectional view through line 4B-4B of FIG. 4A. In FIGS. 4A and 4B, a number of cleaning steps including oxidations and BHF strips are performed to clean sidewalls 150A and 150B and remove crystallographic surface defects from the sidewalls. These cleaning steps cause further undercut of BOX 110 under base surface 140 of fin 135. Fin 135 is now supported only by pedestal 155. The undercut of fin is D on each side of the fin. In one example, D is about 50 to 75 Å. Care must be taken not to completely undercut fin 135. As the total area of contact between base surface 140 of fin 135 and pedestal 155 decreases, the fin becomes more easily broken off.

FIG. 5B is a cross-sectional view through line 5B-5B of FIG. 5A. In FIGS. 5A and 5B, a conformal protective layer 160 is formed over sidewalls 150A and 150B and a top surface 150C of fin 135 and over exposed top surface 115 of BOX 110. Protective layer 160 protects sidewalls 150A and 150B of fin 135 from potential damage from subsequent processing (described infra), and structurally supports the fin. In a first example, protective layer 160 is a tetraethoxysilane (TEOS) oxide formed by plasma-enhanced chemical vapor deposition (PECVD) and is about 15 to 50 Å thick. In a second example, protective layer 160 is silicon nitride formed by low-pressure chemical vapor deposition (LPCVD) and is about 15 to 50 Å thick.

A series of process steps, necessary to form doping regions, such as source/drain (S/D) regions and to tailor doping levels of channel regions within fin 135 are next performed. The steps each include: (1) masking a region of fin 135 with a photoresist mask, (2) performing an ion implantation, (3) removing the photoresist mask (usually in an oxygen plasma), and (4) performing an optional anneal. These four steps can be repeated from 2 to 4 or more times, the exact number of times is dependent upon the dopant level control within fin 135 that is required. Finally, cleans such as a dilute hydrofluoric acid (HF) clean and/or a Huang A clean, and/or Huang B clean are performed. An example of an ion-implantation step is illustrated in FIGS. 6A and 6B and described infra. Without protective layer 160 in place damage may occur to the surfaces of sidewalls 150A and 150B and fin 135 may be undercut to the point where the fin detaches from BOX 110.

FIG. 6B is a cross-sectional view through line 6B-6B of FIG. 6A. In FIGS. 6A and 6B, a photoresist mask 165 is formed over S/D regions 170 of fin 135 and an ion implant performed in channel region 175 of the fin. Ion implant species X may be any species commonly implanted such as B, P, As, and Ge. For a source/drain ion implantation, channel region 175 is masked and the implant performed into S/D regions 170.

FIG. 7B is a cross-sectional view through line 7B-7B of FIG. 7A. In FIGS. 7A and 7B, a photoresist mask 180 is formed over portions of protective layer 160 and BOX layer 110 and the protective layer is removed from fin 135 where it is not protected by the photoresist mask. In the example of protective layer 160 comprising silicon nitride a fluorine based RIE or a hot phosphoric acid etch may be used. In the example of protective layer 160 comprising silicon dioxide a fluorine based RIE or a dilute HF acid etch may be used.

FIG. 8B is a cross-sectional view through line 8B-8B of FIG. 8A. In FIGS. 8A and 8B, a gate dielectric layer 185 is formed on exposed sidewalls 150A and 150B and top surface 150C of fin 135. In one example, gate dielectric layer 185 is thermal oxide about 15 to 50 Å thick.

FIG. 9B is a cross-sectional view through line 9B-9B of FIG. 9A. In FIGS. 9A and 9B, a gate 190 is formed over gate dielectric 185 and fin 135 in channel region 175 of the fin. In the present example, gate 190 is formed by a conformal blanket deposition of a conductive material, a photolithographic masking step and an RIE. Examples of suitable gate materials include doped and undoped polysilicon and metals such as W or Al. Since gate 190 is formed over both sidewalls 150A and 150B of fin 135, the resultant FinFET will be double gated.

Figures 10A, 10B:
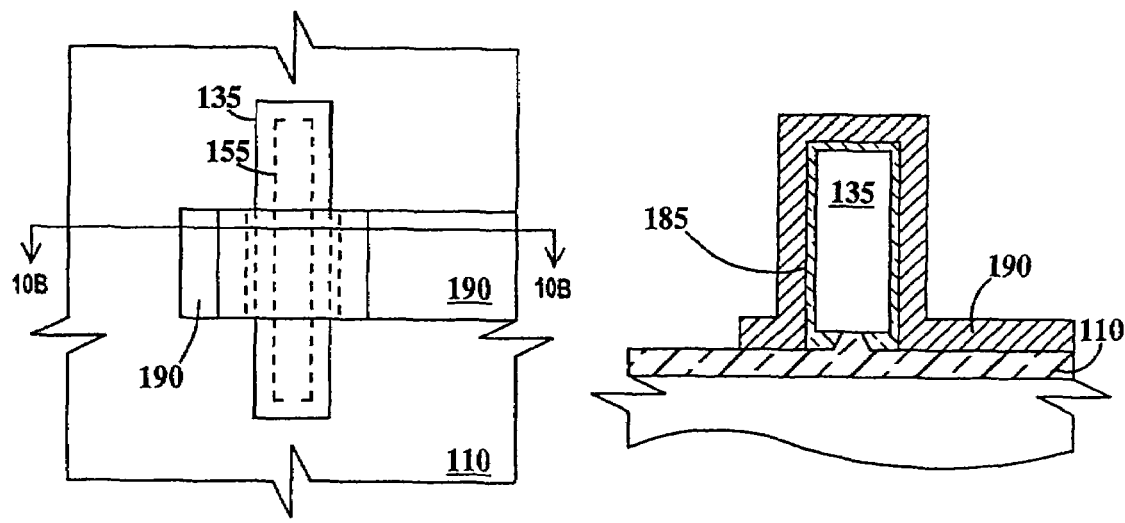

FIG. 10B is a cross-sectional view through line 10B-10B of FIG. 9A. In FIGS. 9A and 9B, any remaining protective layer 160 (see FIG. 9A) is removed using a dilute HF etch or fluorine based RIE or using $H_3PO_4$ if protective layer 160 is silicon nitride. Fin 135 is now supported by gate 190 until an ILD is deposited over the entire FinFET structure.

Figures 11A, 11B:
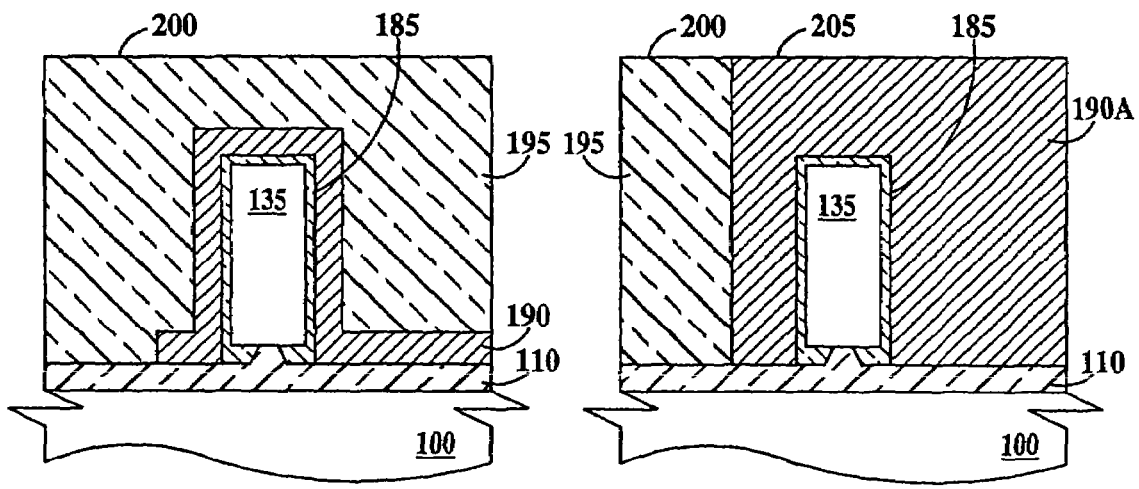
FIG. 11A is a cross-sectional view of a FinFET utilizing a conformal gate as illustrated in FIGS. 10A and 10B after interlevel dielectric (ILD) formation.
FIG. 11B is a cross-sectional view of a FinFET utilizing a damascene planarized gate as after interlevel dielectric (ILD) formation.

FIG. 11A is a cross-sectional view of a FinFET utilizing a conformal gate as illustrated in FIGS. 10A and 10B after ILD formation. In FIG. 10A, an ILD layer 195 is deposited on top of gate 190, exposed surfaces of fin 135 and exposed surfaces of BOX 110. A chemical-mechanical-polish (CMP) process is performed to planarize a top surface 200 of the ILD layer. Examples of ILD materials included TEOS PECVD oxide and fluorine doped glass (FSG). The resultant FinFET is completed by making contacts to the S/D regions 170 (see FIG. 6A) of fin 135 and gate 190 through vias formed in ILD 195.

FIG. 11B is a cross-sectional view of a FinFET utilizing a damascene planarized gate as after interlevel dielectric (ILD) formation. In FIG. 11B, ILD 195 is deposited first and gate 190A is formed by a damascene process. In a damascene process, trenches are formed in an ILD by photolithographically patterning a masking layer applied over the ILD, performing a reactive ion etch (RIE) of the ILD, removing the masking layer, depositing a conductive material of sufficient thickness to fill the trench and performing CMP process to co-planarize the top surfaces of the conductive material and the ILD. In FIG. 11B, top surface 200 of ILD 195 is co-planer with a top surface 205 of gate 190A. With a damascene gate, it may be necessary to form gate dielectric 185 after the trench is etched. The resultant FinFET is completed by making direct contact to gate 185 and contacts to the S/D regions 170 (see FIG. 6A) of fin 135 through vias formed in ILD 195.

FIGS. 12A through 16A are top views and corresponding FIGS. 12B through 16B are cross-sectional views illustrating fabrication of a FinFET structure according to a second embodiment of the present invention.

Figures 12A, 12B:
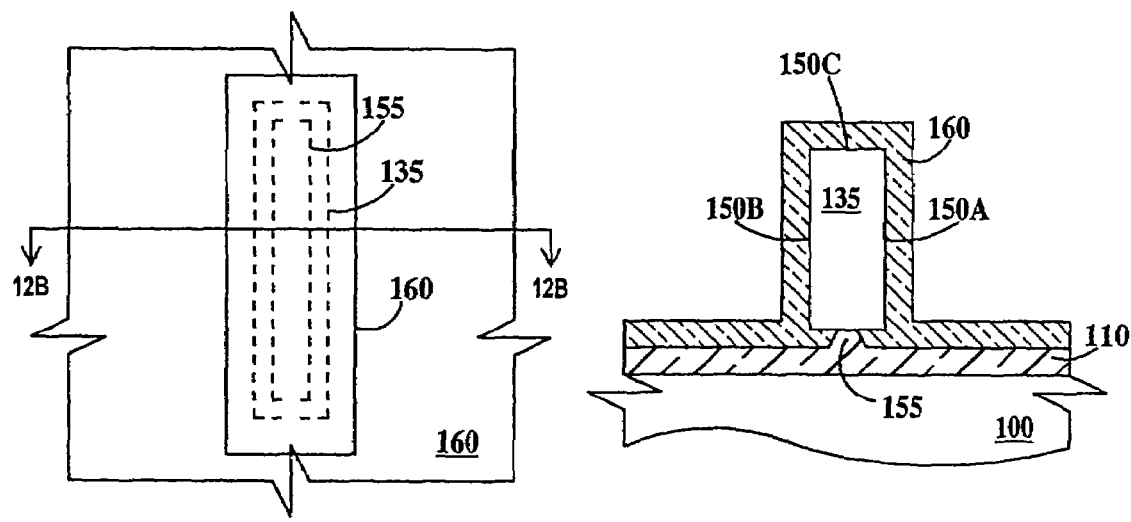

FIG. 12B is a cross-sectional view through line 12B-12B of FIG. 12A. The starting point for the second embodiment is immediately after deposition of protective layer 160 as described supra in reference to FIGS. 5A and 5B and includes all prior steps illustrated in FIGS. 1A(B) through 4A(B). FIGS. 12A and 12B are the same as FIGS. 5A and 5B respectively.

FIG. 13B is a cross-sectional view through line 13B-13B of FIG. 13A. In FIGS. 13A and 13B, an RIE of protective layer 160 (see FIG. 12B) is performed to form supporting spacers 210A and 210B on lower portions 215A and 215B of sidewalls 150A and 150B of fin 135 respectively. Spacers 210A and 210B provide structural support for fin 135.

A series of process steps, necessary to form doping regions, such as source/drain (S/D) regions and tailor channel regions within fin 135 are next performed. The steps each include: (1) masking a region of fin 135 with a photoresist mask, (2) performing an ion implantation, (3) removing the photoresist mask (usually in an oxygen plasma), and (4) performing an optional anneal. These four steps can be repeated from 2 to 4 or more times, the exact number of times is dependent upon the doping level control within fin 135 that is required. Finally cleans such as a dilute hydrofluoric acid (HF) clean and/or a Huang A clean, and/or Huang B clean are performed. An example of an ion-implantation step is illustrated in FIGS. 14A and 14B and described infra.

FIG. 14B is a cross-sectional view through line 14B-14B of FIG. 14A. In FIGS. 14A and 14B, a photoresist mask 165 is formed over S/D regions 170 of fin 135 and an ion implant performed in channel region 175 of the fin. Ion implant species X may be any species commonly implanted such as B, P, As, and Ge. For a source/drain ion implantation, channel region 175 is masked and the implant performed into S/D regions 170.

Figure 15A:
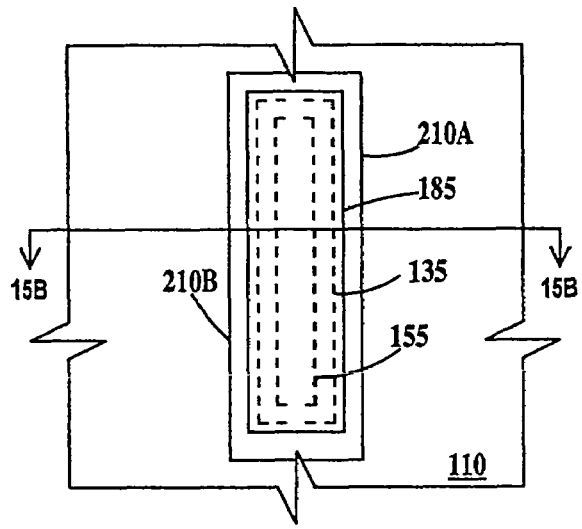
Figure 15B:
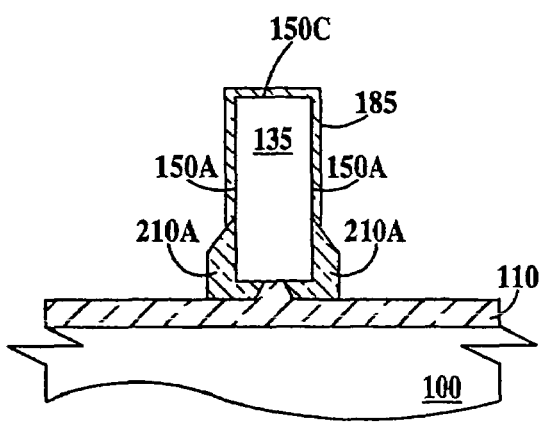

FIG. 15B is a cross-sectional view through line 15B-15B of FIG. 15A. In FIGS. 15A and 15B, a gate dielectric layer 185 is formed on exposed sidewalls 150A and 150B and top surface 150C of fin 135. In one example, gate dielectric layer 185 is thermal oxide about 15 to 50 Å thick. Spacers 210A and 210B will be incorporated into the completed FinFET device. Alternatively, support spacers 210A and 210B may be first removed by RIE prior to formation of gate dielectric 185.

Figure 16A:
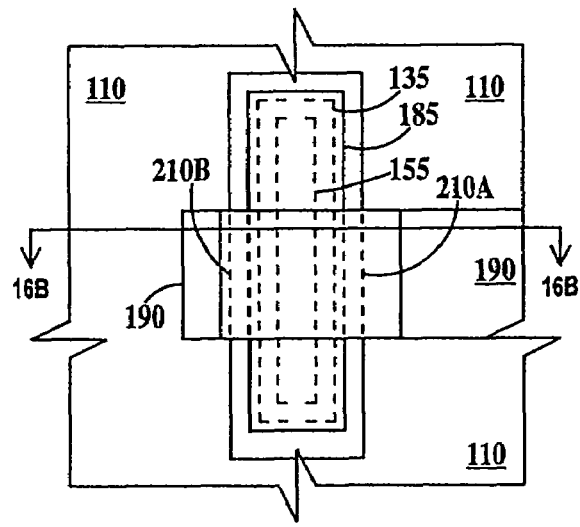
Figure 16B:
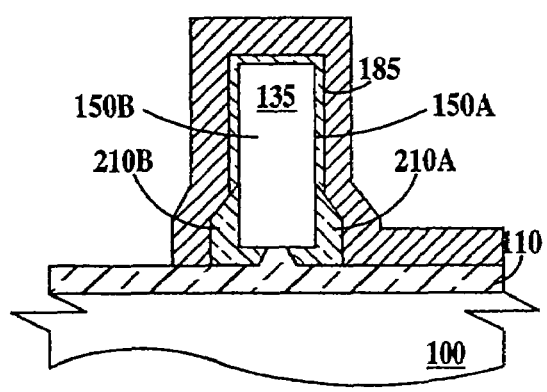

FIG. 16B is a cross-sectional view through line 16B-16B of FIG. 16A. In FIGS. 16A and 16B, a gate 190 is formed over gate dielectric 185 and fin 135 in channel region 175 of the fin. In the present example, gate 190 is formed by a conformal blanket deposition of a conductive material, a photolithographic masking step and an RIE. Examples of suitable gate materials include doped and undoped polysilicon and metals such as W or Al. Since gate 190 is formed over both sidewalls 150A and 150B of fin 135, the resultant FinFET will be double gated. The FinFET may be completed as describes supra for the first embodiment of the present invention.

Figure 17E:
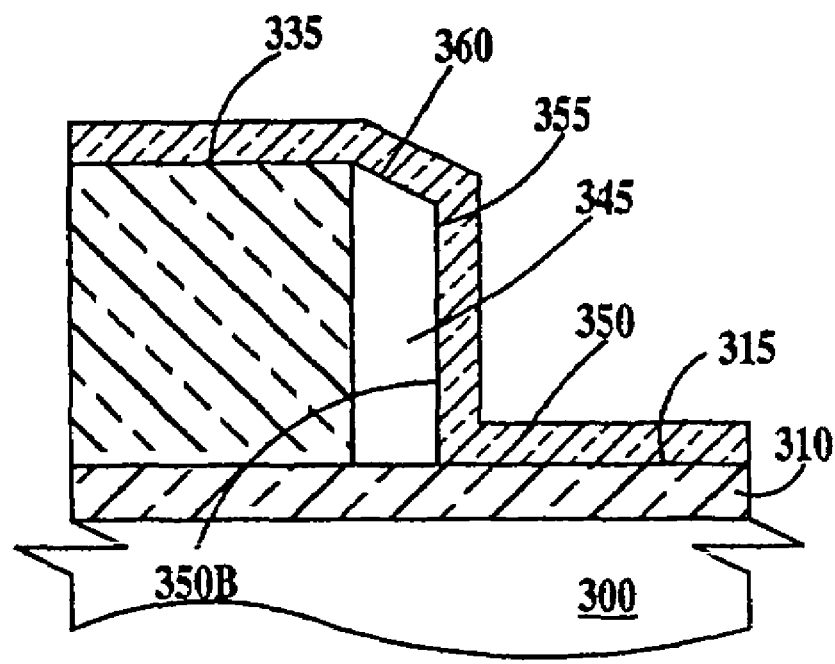
Figure 17F:
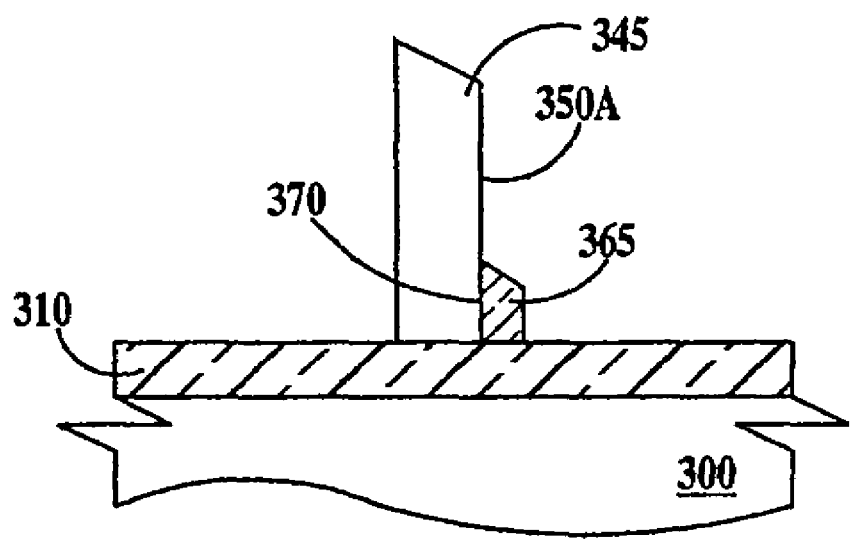

FIGS. 17A through 17F are cross-sectional views illustrating fabrication of a FinFET structure according to a third embodiment of the present invention. In FIG. 17A, a semiconductor substrate 300 is provided. Formed on a top surface 305 of substrate 300 is a BOX 310. Formed on a top surface 315 of BOX 310 is a mandrel layer 320. In one example, mandrel layer 320 is silicon nitride. In FIG. 17B, mandrel layer 320 (see FIG. 17A) is photo-lithographically patterned and an RIE performed to form a mandrel 325. In FIG. 17C, an amorphous silicon or poly crystalline silicon layer 330 is conformally deposited on a top surface 335, on a sidewall 340 of mandrel 325 and on exposed top surface 315 of BOX 310. In one example, silicon layer 330 is formed by sputtering silicon. Silicon layer 330 is subjected to a high temperature anneal to convert it to a monocrystalline silicon layer. In FIG. 17D, silicon layer 330 (see FIG. 17C) is an RIE performed to form a fin 345. An inner sidewall 350A of fin 345 is in contact with sidewall 340 of mandrel 335. In FIG. 17E, a conformal protective layer 350 is formed over top surface 335 of mandrel 325, a top surface 360 and an outer sidewall 350B of fin 345 and exposed top surface 315 of BOX 310. In FIG. 17F, an RIE process is performed to form a supporting spacer 365 in contact with a lower portion 370 of outer sidewall 350A of fin 345. Further processing as described supra may be performed to complete a FinFET device. Supporting spacer 365 may be removed later in processing or left in place and incorporated into the completed FinFET device.

Thus, the present invention discloses a method of fabricating FinFETs having very thin fins that have sidewall surfaces that are crystallographically closer to perfect and that overcomes the inherent structural weakness of thin fins.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A FinFET device, comprising:
   a dielectric layer on a top surface of a semiconductor substrate, said dielectric layer having a thin region and a thick region;
   a silicon fin having a bottom surface, a top surface and sidewalls, said bottom surface of said fin on a top surface of said thick region and overhanging said thin region to define a space bounded by said bottom surface of said fin and a top surface of said thin region;
   a source and a drain formed in opposite ends of said fin, said source and said drain separated by a channel region;
   a gate dielectric layer on said sidewalls of said fin only in said channel region, said gate dielectric layer extending under said bottom surface of said fin and completely filling said space; and
   an electrically conductive gate electrode in direct physical contact with said gate dielectric layer and said top surface of said thin region.

2. The FinFET device of claim 1, wherein said fin has a height of about 500 to 2000 Å and has a width of about 200 to 500 Å.

3. The FinFET device of claim 1, wherein said silicon fin comprises mono-crystalline silicon.

4. The FinFET of claim 1, wherein said thin region of said dielectric layer extends under said source/drain regions.

5. The FinFET of claim 1, wherein said thick region of said dielectric layer extends under said source/drain regions.

6. The FinFET device of claim 1, wherein said gate dielectric extends over said top surface of said fin in said channel region.

7. The FinFET device of claim 1, wherein said gate electrode comprises a conformal layer following contours of said fin in said channel region.

8. A FinFET device, comprising:
   a dielectric layer on a top surface of a semiconductor substrate, said dielectric layer having a thin region and a thick region;
   a silicon fin having a bottom surface, a top surface and sidewalls, said bottom surface of said fin on a top surface of said thick region and overhanging said thin region to define a space bounded by said bottom surface of said fin and a top surface of said thin region;
   a source and a drain formed in opposite ends of said fin, said source and said drain separated by a channel region;
   a gate dielectric layer on a upper region of said sidewalls of said fin;
   a conformal protective layer on a lower region of said sidewalls, said protective layer extending under said fin and completely filling said space; and
   an electrically conductive gate electrode in direct physical contact with said gate dielectric layer and said protective layer only over said channel region, said gate electrode in direct physical contact with top surface of said thin region.

9. The FinFET device of claim 8, wherein said protective layer comprises tetaethoxysilane oxide or silicon nitride.

10. The FinFET device of claim 8, wherein said protective layer is about 15 to 50 Å thick., said fin has a height of about 500 to 2000 Å and has a width of about 200 to 500 Å.

11. The FinFET device of claim 8, wherein said silicon fin comprises mono-crystalline silicon.

12. The FinFET device of claim 8, wherein said gate dielectric extends over said top surface of said fin in said channel region.

13. The FinFET device of claim 8, wherein said gate electrode comprises a conformal layer following contours of said fin in said channel region.

14. The FinFET of claim 8 wherein said thin region of said dielectric layer extends under said source/drain regions.

15. The FinFET of claim 8, wherein said thick region of said dielectric layer extends under said source/drain regions.

* * * * *